US 11,802,903 B2

(12) United States Patent
Sun et al.

(10) Patent No.: US 11,802,903 B2
(45) Date of Patent: *Oct. 31, 2023

(54) BI-DIRECTIONAL COUPLER WITH TERMINATION POINT FOR A TEST POINT

(71) Applicant: ARRIS Enterprises LLC, Suwanee, GA (US)

(72) Inventors: Zhijian Sun, Avon, CT (US); Eric J. Cormier, Bristol, CT (US); Zoran Maricevic, West Hartford, CT (US); Brent Arnold, Doylestown, PA (US)

(73) Assignee: ARRIS Enterprises LLC, Suwanee, GA (US)

( * ) Notice: Subject to any disclaimer, the term of this patent is extended or adjusted under 35 U.S.C. 154(b) by 192 days.

This patent is subject to a terminal disclaimer.

(21) Appl. No.: 17/286,788

(22) PCT Filed: Oct. 17, 2019

(86) PCT No.: PCT/US2019/056729
§ 371 (c)(1),
(2) Date: Apr. 19, 2021

(87) PCT Pub. No.: WO2020/081807
PCT Pub. Date: Apr. 23, 2020

(65) Prior Publication Data
US 2021/0341532 A1  Nov. 4, 2021

(51) Int. Cl.
*G01R 31/28* (2006.01)
*G01R 31/317* (2006.01)

(52) U.S. Cl.
CPC ..... *G01R 31/2844* (2013.01); *G01R 31/2834* (2013.01); *G01R 31/2843* (2013.01); *G01R 31/31728* (2013.01)

(58) Field of Classification Search
None
See application file for complete search history.

(56) References Cited

U.S. PATENT DOCUMENTS 10,416,212 B2 * 9/2019 Saedi ............... G01R 27/32
10,651,958 B1 * 5/2020 Sun ................. H01P 1/26
(Continued)

FOREIGN PATENT DOCUMENTS

EP  0827297 A2 * 3/1998 ......... H04B 10/2589

OTHER PUBLICATIONS

International Preliminary Report on Patentability Re: Application No. PCT/US2019/056729 (dated Apr. 29, 2021).

*Primary Examiner* — Jermele M Hollington
(74) *Attorney, Agent, or Firm* — Chernoff, Vilhauer, McClung & Stenzel, LLP

(57) ABSTRACT

In one embodiment, an apparatus includes a bi-directional coupler for coupling an upstream signal and a downstream signal to a termination load. A test point detection mechanism is configured to detect when a test point device is inserted in a test point connector. The test point device is configured to perform a test of the upstream signal or the downstream signal. A switch is configured to switch from being coupled to the termination load to being coupled to the test point device when the test point device is detected as being inserted in the test point connector. The switch is configured to switch from being coupled to being coupled to the test point device to the termination load when the test point device is detected as being removed from being inserted in the test point connector.

19 Claims, 14 Drawing Sheets

(56) References Cited

U.S. PATENT DOCUMENTS

| | | | |
|---|---|---|---|
| 11,626,935 B2* | 4/2023 | Flask | H04B 17/309 |
| | | | 370/252 |
| 2017/0077988 A1* | 3/2017 | Flask | H04L 1/24 |
| 2017/0324392 A1 | 11/2017 | Srirattana et al. | |
| 2018/0124706 A1 | 5/2018 | Mini et al. | |
| 2020/0125153 A1* | 4/2020 | Sun | G06F 1/26 |

* cited by examiner

BI-DIRECTIONAL COUPLER WITH TERMINATION POINT FOR A TEST POINT

BACKGROUND

A test point may be used to measure the performance of an upstream or downstream connection in a network. In one implementation, two separate directional couplers are used to connect two test points (TPs) to measure an upstream and a downstream signal. One directional coupler for a first test point is used for the downstream direction and a second directional coupler for a second test point is used for the upstream connection. This leaves an isolating port that is terminated by a termination load, such as a 75-ohm termination load if the test point also has a load of 75-ohms. The coupler directivity is limited by how good the isolating port is terminated and this achieves maximum directivity performance because the load of the isolating port is the same as the load of the test point.

In a full duplex node design, the use of two separate couplers may add too much of a loss at an output of a power amplifier connected to the coupler. With use of two separate couplers, the insertion loss will be doubled, from 1 dB in single coupler case to 2 dB in two coupler case. The output RF amplifier may already be running very close to its clipping point. With the use of a single coupler, the RF amplifier will not need to provide as much amplification compared to the two coupler case, which will improve the system level modulation error ration or bit error ratio (MER/BER) performance. Accordingly, a single bi-directional coupler may have to be used for both the upstream direction and the downstream direction. One advantage of using a bi-directional coupler is there is a lower insertion loss in the connection because only one coupler is used in both the upstream and the downstream directions. However, isolation between the upstream connection and the downstream connection may be an issue. The directivity of a coupler is defined as the power difference at any given coupling port when the same amount of power is injected into either the downstream direction or the upstream direction. A coupler may have around 25-30 decibels (dB) directivity, which means there may be 25-30 dB isolation between the upstream direction and the downstream direction at any given coupling port. However, this is based on an ideal 75-ohm termination at the isolating port. In a bi-directional coupler, the termination at the isolating port is typically not the perfect 75-ohm termination and thus will limit the isolation between the downstream and the upstream to the return loss of the isolating port. For example, the ideal isolation may not be achieved because one or both of the upstream test point and the downstream test point may not be connected to the bi-directional coupler. For example, a user may only be using one of the test points to test network traffic in one direction. This leaves an open test point port. In the full duplex node design, a 20 dB test point is required and a 10 dB coupler is used. The best return loss from the open test point port is 20 dB, which would limit the coupler directivity at 20 dB even when the coupler has 30 dB directivity by design when all ports are properly terminated. In the worst case, when two reflections are added in phase from two open test point ports, the total isolation between the downstream connection and the upstream connection could be as low as 16 dB.

In a network implementation, a physical (PHY) device can be located in the headend and converts packets on a digital interface, such as an Ethernet interface, to analog signals, such as radio frequency (RF) signals, on a hybrid fiber coaxial (HFC) network. The physical device sends the RF signals to modems located at a subscriber's premises. However, other implementations, such as a distribution access architecture (DAA), have moved the physical device to a location closer to the subscriber's premises, such as in a node located in the neighborhood where the subscribers are located. The relocated physical device is referred to as a remote physical device (RPD).

The DAA in the longer term may replace analog fiber with Internet protocol (IP) digital connections. However, many cable operators in the shorter term and in the early DAA deployment, envision an analog radio frequency (RF) overlay on top of the digital connections (e.g., the digital optical links) to continue to leverage the already-deployed analog broadcast channel assets (e.g., analog network deployments). Digital optical links are typically implemented via multi-source agreement (MSA) compliant digital small form pluggable (SFP) optical transceiver modules. Analog overlay solutions for DAA deployments also may leverage standard packaging design used in the MSA-compliant digital SFP optical transceiver modules. For example, an analog SFP transceiver module may look similar to the digital SFP transceiver module when viewed by a user. Further, both the digital and analog SFP modules leverage MSA specifications, such as a similar physical pin-out between a digital SFP module and analog SFP module may be similar or exactly the same. Also, both the digital SFP module and analog SFP module may use the same pin to receive a power supply voltage, such as pin #16. However, the digital SFP module and analog SFP module may use different power supply voltages, such as the analog SFP module may use a +5 volt (V) power supply voltage and the digital SFP module may use a +3.3V power supply voltage. Because the analog SFP module and digital SFP module may use the same pin for the power supply, when a digital SFP module is inadvertently inserted into an analog SFP module slot, the digital SFP module will be immediately damaged due to the +5V power supply being provided to the digital SFP module instead of the +3.3V power supply.

DETAILED DESCRIPTION

Described herein are techniques for a bi-directional coupler system. In the following description, for purposes of explanation, numerous examples and specific details are set forth in order to provide a thorough understanding of some embodiments. Some embodiments as defined by the claims may include some or all of the features in these examples alone or in combination with other features described below, and may further include modifications and equivalents of the features and concepts described herein.

Some embodiments include a first switch that is controlled to terminate a first port of a bi-directional coupler when a first test point is not connected to the first port. Also, some embodiments include a second switch that is controlled to terminate a second port of the bi-directional coupler when a second test point is not connected to the second port. The bi-directional coupler may couple an upstream signal in an upstream direction and a downstream signal in a downstream direction. The first switch is used at an upstream port and the second switch is used at a downstream port. The switches may toggle between a termination load and a test point. When the test point is inserted in a test point connector, the first switch connects the test point to the bi-directional coupler. However, when an upstream test point is not inserted in an upstream test point connector, the first switch switches to connect a first termination load to the upstream port. Also, when a downstream test point is not inserted in a downstream test point connector, the second switch switches to connect a second termination load to the downstream port.

The use of the switch and the termination loads improve the coupler directivity because there is not an open test point connection at one of the upstream port or downstream port when one of the upstream test point or the downstream test point is not inserted in a test point connector. For example, all ports of the bi-directional coupler are properly terminated at all times and the bi-directional coupler may have the maximum directivity afforded by the design of the bi-directional coupler.

System Overview

Figure 1:
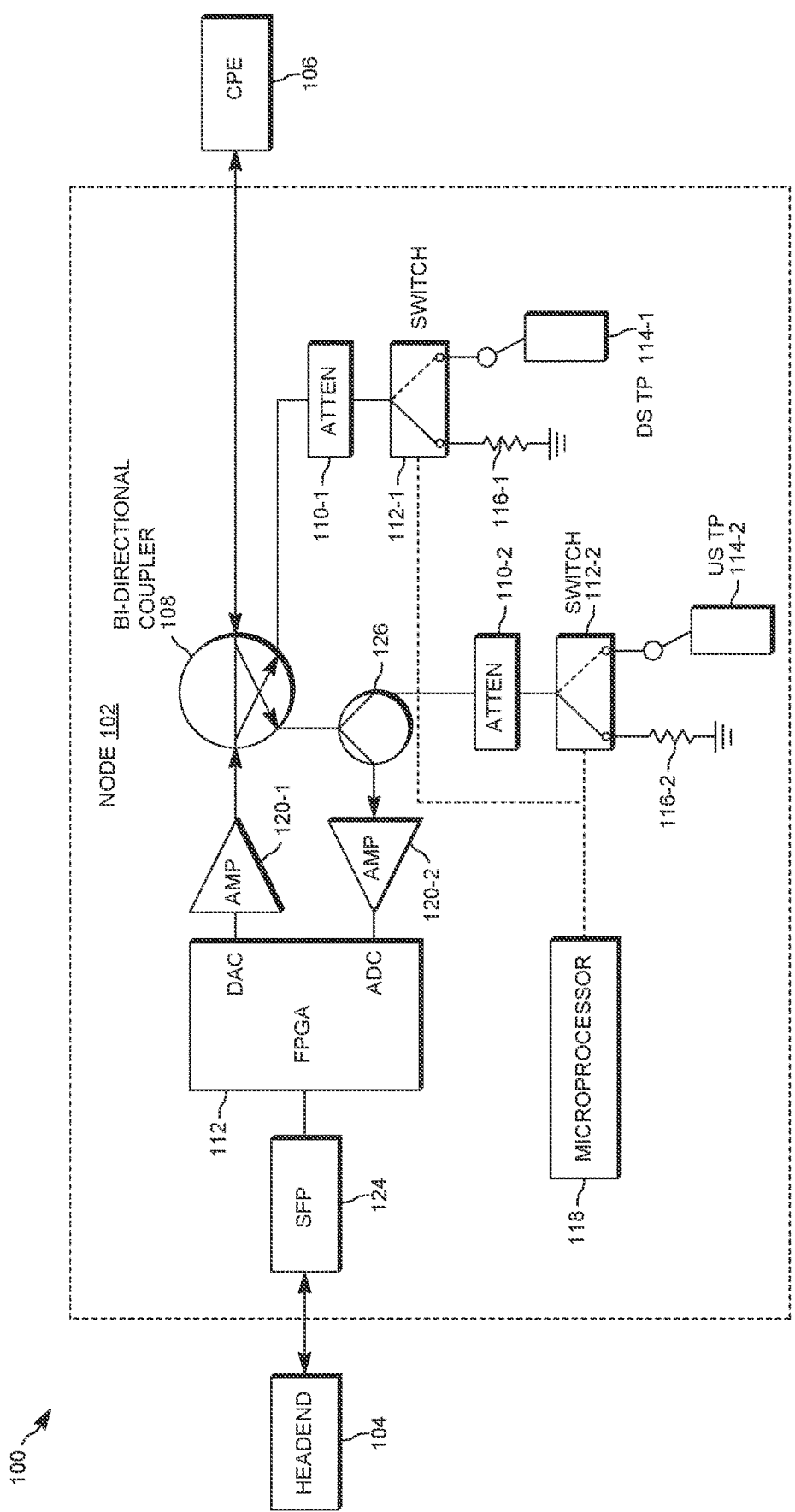
FIG. 1 depicts a simplified system that terminates ports in a bi-directional coupler according to some embodiments.

FIG. 1 depicts a simplified system 100 that terminates ports in a bi-directional coupler according to some embodiments. System 100 includes a node 102, a head end 104, and customer premise equipment (CPE) 106. In some embodiments, node 102 is separate from headend 104. However, components of node 102 may also be included in head end 104. In some cases, an operator would like to have a test point inserted in both directions so that the operators can check system level performance without interrupting the operation of a live network. Although the following network is described, some embodiments may be used in other network configurations, such as WiFi or wireless networks.

In a full duplex design, the downstream connection and the upstream connection may use the same spectrum. A single bi-directional coupler 108 may be used to couple the downstream signal to downstream components for processing and also couple the upstream signal to the upstream components for processing. Using the bi-directional coupler 108 is different from using a separate coupler for the upstream direction and a separate coupler for the downstream direction as described in the Background.

In the downstream direction, head end 104 may send a signal to node 102, such as a digital signal through a digital medium. In some embodiments, the signal may be programming for a cable television system; however, other content may be sent. In other examples, head end 104 may send an analog signal through an analog medium to node 102.

A small-form pluggable transceiver (SFP) 124 may receive the downstream signal. In some embodiments, the transceiver may be a regular SFP digital transceiver or an enhanced SFP transceiver (SFP+) that may have more bandwidth capabilities then the regular SFP transceiver. Also, an analog signal may be received and processed by an analog receiver.

A field programmable logic gate array (FPGA) 112 receives the signal and can convert the downstream signal using a digital-to-analog converter (DAC) from the digital signal to an analog signal. An amplifier 120-1, such as an RF amplifier, amplifies the analog signal and sends the analog signal to bi-directional coupler 108. Bi-directional coupler 108 may then couple the downstream signal to CPE 106, which may be a cable modem or other subscriber device. CPE 106 receives the signal and can output the signal, such as to a subscriber device.

In the upstream direction, CPE 106 may send an upstream signal to node 102. The upstream signal may be an analog signal. Bi-directional coupler 108 may couple the upstream signal through a splitter 126. Splitter 126 splits the signal and sends the signal to an amplifier, such as an RF amplifier 120-2. After amplifying the analog signal, FPGA 122 may use an analog-to-digital converter (ADC) to convert the analog signal to a digital signal. The digital signal is sent through SFP 124 to head end 104. In other examples, node 102 may send an analog signal.

In some embodiments, test points may be inserted into an upstream connection or a downstream connection in node 102. For example, node 102 may have a test point connector (e.g., slot or other connection device) in which test points can be inserted. When the term inserted is used, the insertion may be any type of connection that can be made with a test point 114. For example, test point 114 may be inserted in a slot, connected to a connection pad, etc. When inserted, test point 114 may be connected to a board, such as an integrated circuit board, in which test point 114 is now operational and powered on.

When inserted, the test points may be used to test the connection. An upstream test point (US TP) 114-2 may be used to test the connection (e.g., bandwidth or other performance metrics) in the upstream direction, which is from CPE 106 to head end 104 through node 102. A downstream test point (DS TP) 114-1 may be used to test the connection of a downstream connection from head end 104 to CPE 106 through node 102. Downstream test point 114-1 and upstream test point 114-2 may or may not be inserted into a test point connector. That is, both downstream test point 114-1 and upstream test point 114-2 may be connected, both downstream test point 114-1 and upstream test point 114-2 may not be connected, downstream test point 114-1 may be connected, but upstream test point 114-2 may not be connected, and upstream test point 114-1 may be connected, but downstream test point 114-1 may not be connected.

When downstream test point 114-1 is inserted into a downstream test point connector of bi-directional coupler 108, bi-directional coupler 108 may couple to the downstream signal to downstream test point 114-1 at a downstream test point port. For example, bi-directional coupler 108 may couple the downstream signal through attenuator 110-1, a switch 112-1 (e.g., an RF switch) to downstream test point 114-1. Although attenuation of the signal may be performed, attenuation may not be needed.

When downstream test point 114-1 is not inserted in a test point connector, a termination load 116-1 is connected to bi-directional coupler 108 at the downstream test point port. For example, the downstream test point port is connected through attenuator 110-1, switch 112-1 to termination load 116-1, which may be a 75-ohm load. The 75-ohm load may match the load of upstream test point 114-2 or termination load 116-2. The matching of the loads provides maximum directivity for bi-directional coupler 108.

When an upstream test point 114-2 is inserted into an upstream test point connector of bi-directional coupler 108, the upstream signal is sent from the upstream test point port of bi-directional coupler 108 through splitter 126. Splitter 126 splits the signal and sends the signal to attenuator 110-2 and switch 112-2 to upstream test point 114-2.

When upstream test point 114-2 is not connected to a test point connector, switch 112-2 switches to connect termination load 116-2 to the upstream test point port. For example, the upstream test point port is connected through attenuator 110-2, switch 112-2 to termination load 116-2, which may be a 75-ohm load. The 75-ohm load may match the load of downstream test point 114-1 or termination load 116-1. The matching of the loads also provides maximum directivity for bi-directional coupler 108.

A microprocessor 118 may control switch 112-2 to couple the upstream test point port to upstream test point 114-2 or termination load 116-2. Also, microprocessor 118 may control switch 112-1 to couple downstream test point 114-1 and termination load 116-1 to the downstream test point port. Microprocessor 118 may analyze whether or not downstream test point 114-1 or upstream test point 114-2 is inserted in a respective test point connector to determine the position of switch 112-1 and 112-2, respectively.

Bi-Directional Coupler

Figure 2:
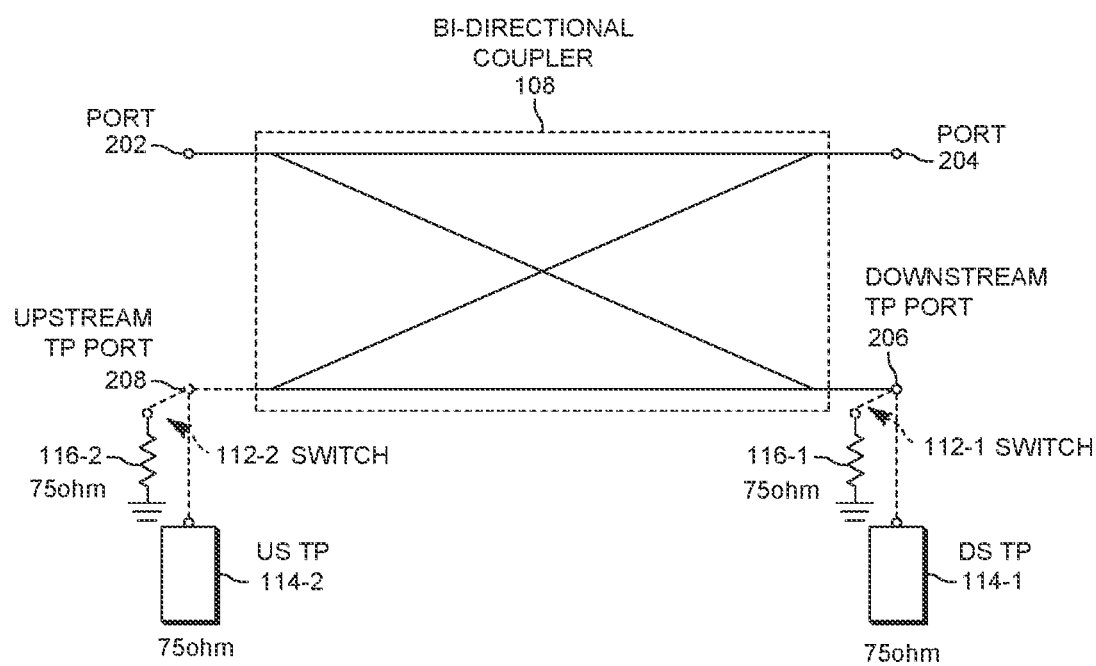
FIG. 2 depicts a more detailed example of a bi-directional coupler according to some embodiments.

FIG. 2 depicts a more detailed example of bi-directional coupler 108 according to some embodiments. Bi-directional coupler 108 includes a first port 202, a second port 204, a downstream test point (TP) port 206 and an upstream test point (TP) port 208. First port 202 and second port 204 may be both used for the upstream signal and the downstream signal. For example, when bi-directional coupler 108 is coupling the downstream signal downstream, first port 202 is an input downstream port that receives the downstream signal and second port 204 is an output downstream port that outputs the downstream signal. When bi-directional coupler 108 is coupling the upstream signal upstream, second port 204 is an input upstream port that receives the upstream signal and first port 202 is an output upstream port that outputs the upstream signal.

Switch 112-2 can switch between termination load 116-2 and upstream test point 114-2. As shown, both upstream test point 114-2 and termination load 116-2 may have a 75-ohm load. Although a 75-ohm load is used, the load may be different values. For example, load impedance is 75 ohm for a 75 ohm system (e.g., cable television networks) and 50 ohm for a 50 ohm system (e.g., a WiFi or a wireless system). However, termination load 116-2 may have the same load (or very similar within a threshold) as downstream test point 114-1 to provide the maximum isolation and maximum directivity when upstream test point 114-2 is not connected to upstream test point port 208.

Switch 112-1 may also switch between termination load 116-1 and downstream test point 114-1. Similarly, termination load 116-1 and downstream test point 114-1 have the same load of 75-ohms. Termination load 116-1 may have the same load (or very similar within a threshold) as upstream test point 114-2 to provide the maximum isolation and directivity when test point 114-1 is not connected to downstream test point port 206.

Figure 3A:
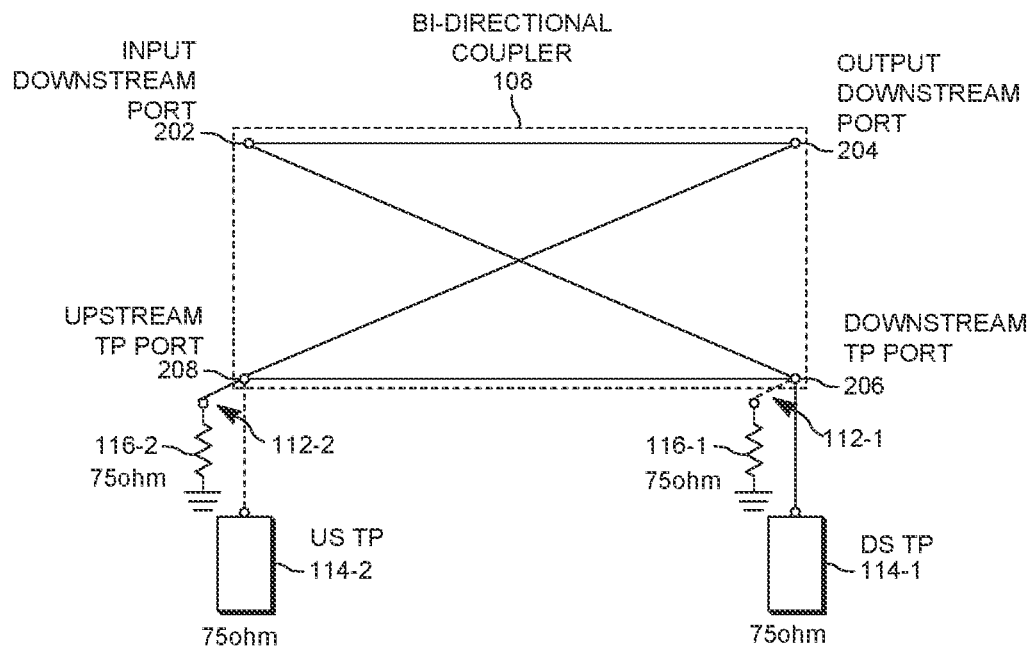
FIG. 3A shows the downstream connection without an upstream test point connected to the bi-directional coupler according to some embodiments.
Figure 3B:
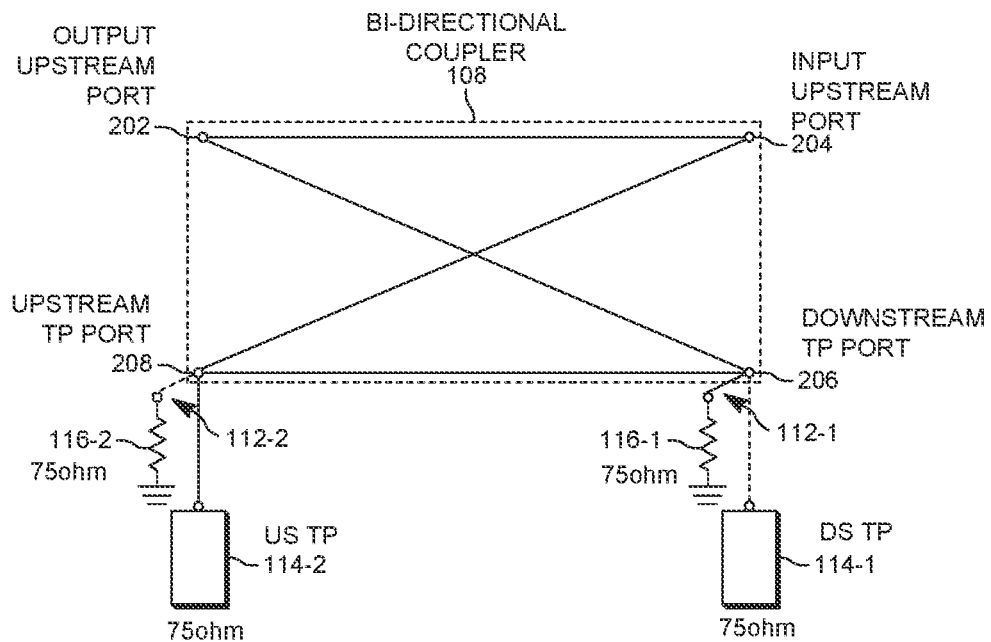
FIG. 3B shows the upstream connection without a downstream test point connected to a bi-directional coupler according to some embodiments.
Figure 3C:
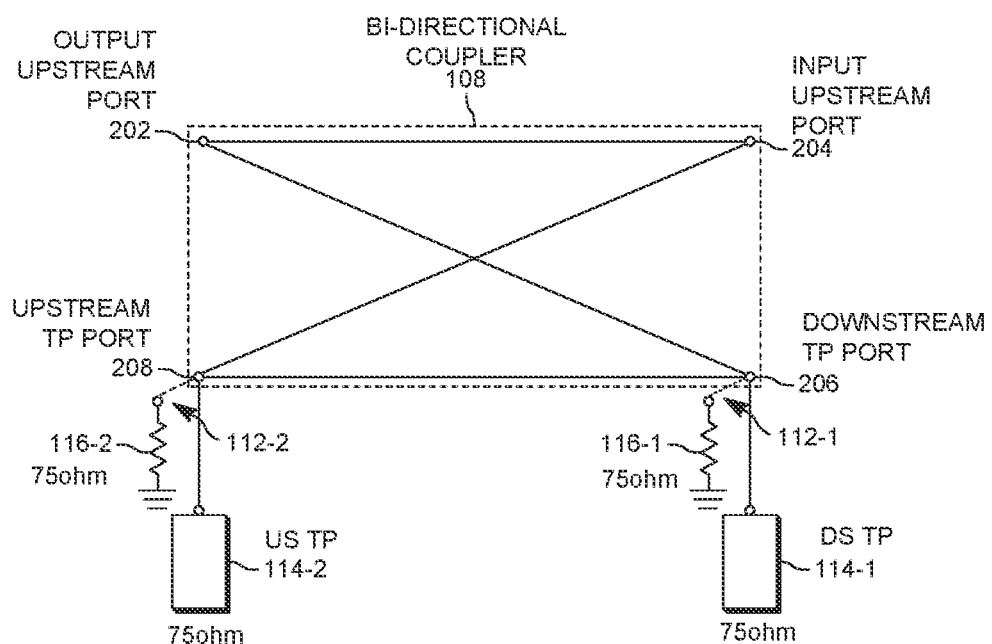
FIG. 3C shows a connection with both the downstream test point and the upstream test point connected to the bi-directional coupler according to some embodiments.

As discussed above, different combinations of which test points are inserted into test point connections may be appreciated. FIGS. 3A, 3B, and 3C show different connections for bi-directional coupler 108 according to some embodiments. FIG. 3A shows the downstream connection without upstream test point 114-2 connected to bi-directional coupler 108 according to some embodiments. Downstream test point 114-1 has been inserted into a test point connector and is connected to bi-directional coupler 108.

Input downstream port 202 receives a downstream signal and the downstream signal is coupled to output downstream port 204. Also, the downstream signal is coupled to downstream test point port 206 because switch 112-1 is switched to downstream test point 114-1. Accordingly, termination load 116-1 is not connected to bi-directional coupler 108.

Upstream test point port 208 is also coupled to output downstream port 204. This port needs to be properly terminated to provide maximum isolation in the downstream direction. In this example, upstream test point 114-2 is not inserted in a test point connector. Accordingly, switch 112-2 is switched to couple termination load 116-2 to upstream test point port 208 thereby terminating upstream test point port 208 and not leaving an open port. Termination load 116-2 is the same load as downstream test point 114-1 to provide maximum directivity.

FIG. 3B shows the upstream connection without downstream test point 114-1 connected to bi-directional coupler 108 according to some embodiments. Input upstream port 204 receives an upstream signal and couples the upstream signal to output upstream port 202. Also, input upstream port 204 couples the upstream signal to upstream test point port 208. Upstream test point 114-2 has been inserted into a test point connector and is connected to bi-directional coupler 108 via switch 112-2. Accordingly, termination load 116-2 is not connected to bi-directional coupler 108.

Also, output upstream port 202 is coupled to downstream test point port 206. This port needs to be properly terminated to provide maximum isolation in the upstream direction. In this example, downstream test point 114-1 is not inserted in a test point connector. Accordingly, switch 112-1 is switched to couple termination load 116-1 to downstream test point port 206 thereby terminating downstream test point port 206. Termination load 116-1 is the same load as upstream test point 114-2 to provide maximum directivity.

FIG. 3C shows a connection with both downstream test point 114-1 and upstream test point 114-2 connected to bi-directional coupler 108 according to some embodiments. Since both downstream test point 114-1 and upstream test point 114-2 are inserted into a respective test point connector, termination loads are not needed. Switch 112-1 connects downstream test point 114-1 to downstream test point port 206 and switch 112-2 connects upstream test point 114-2 to upstream test point port 208. Both test points 114-1 and 114-2 are the same load and provide maximum directivity for bi-directional coupler 108.

In some embodiments, both downstream test point 114-1 and upstream test point 114-2 may not be inserted into test point connectors. In this example, switch 112-1 is connected to termination load 116-1 and switch 112-2 is connected to termination load 116-2.

Different Examples of Detection Mechanisms

Figure 4A:
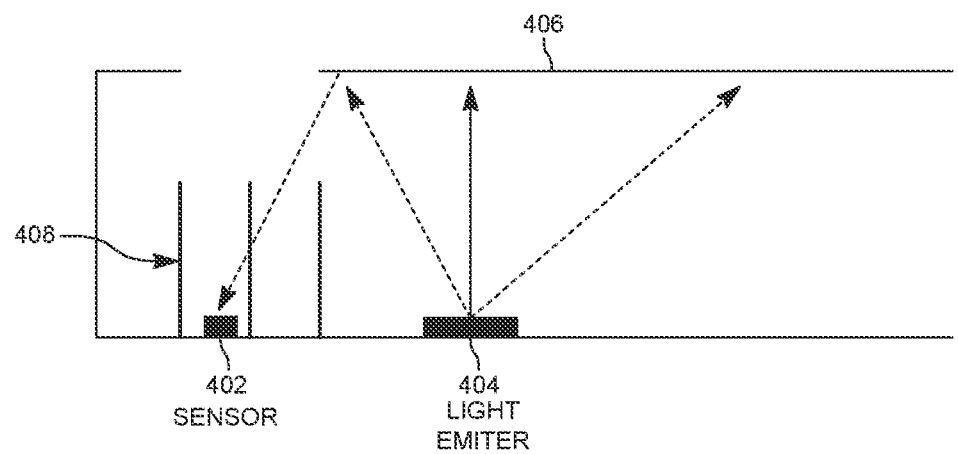
FIGS. 4A and 4B show a sensor being used to detect when a test point is inserted into a test point connector according to some embodiments.
Figure 4B:
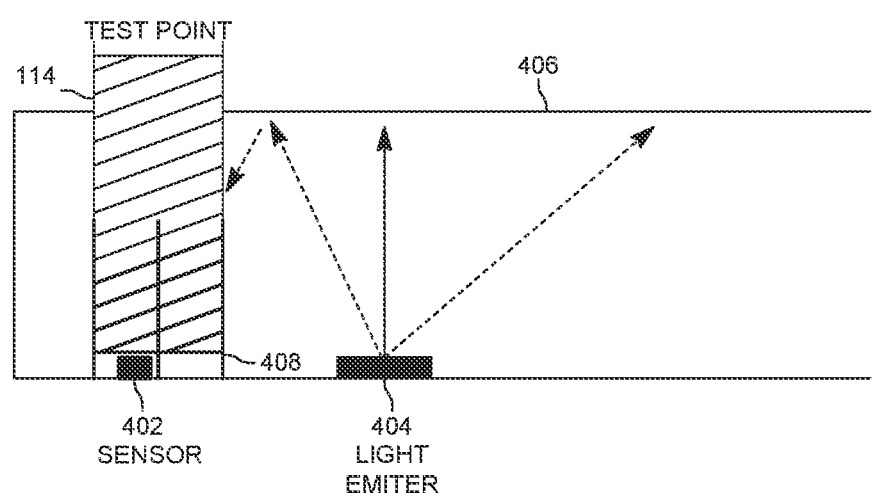

The following describes some examples of detection mechanisms. Although these examples of detection mechanisms are described, other examples of detection mechanisms may be used. FIGS. 4A and 4B show a sensor 402 being used to detect when a test point is inserted into a test point connector 408 according to some embodiments. In FIG. 4A, sensor 402, such as a light sensor, can detect a signal, such as light. Sensor 402 may be located in test point connector 408 in which a test point 114 may be inserted. For example, sensor 402 may be on a circuit board in which test point 114 may be inserted to connect to test point connector 408.

Node 102 includes an emitter, such as light emitter 404, that emits the signal, such as light, which may be detected by sensor 402. For example, light may reflect off a surface 406 in node 102 to sensor 402. However, in other examples, the light may not need to be reflected off a surface. Rather, the light may be emitted directly to sensor 402.

FIG. 4B shows an example when a test point 114 is inserted into test point connector 408 according to some embodiments. When test point 114 is inserted into test point connector 408, test point 114 becomes operational as in test point 114 can test network characteristics for node 102. However, test point 114 needs to be coupled to a port of bi-directional coupler 108. When the light emitted by emitter 404 is blocked from reaching light sensor 402, light sensor 402 may output a signal indicating that test point 114 has been inserted in test point connector 408. In some embodiments, the light may be blocked test point 114 thereby blocking the light from reaching light emitter 404. Microprocessor 118 uses the signal from light sensor 402 to change a position of switches 112-1 and/or 112-2 to couple a test point 114 to upstream test point port 208 and/or downstream test point port 206 as described above.

Figure 5A:
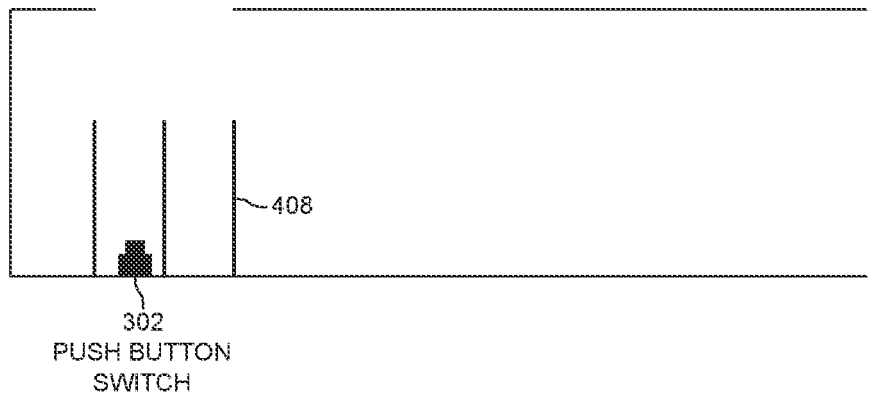
FIGS. 5A and 5B depict an example of a push-button switch according to some embodiments.
Figure 5B:
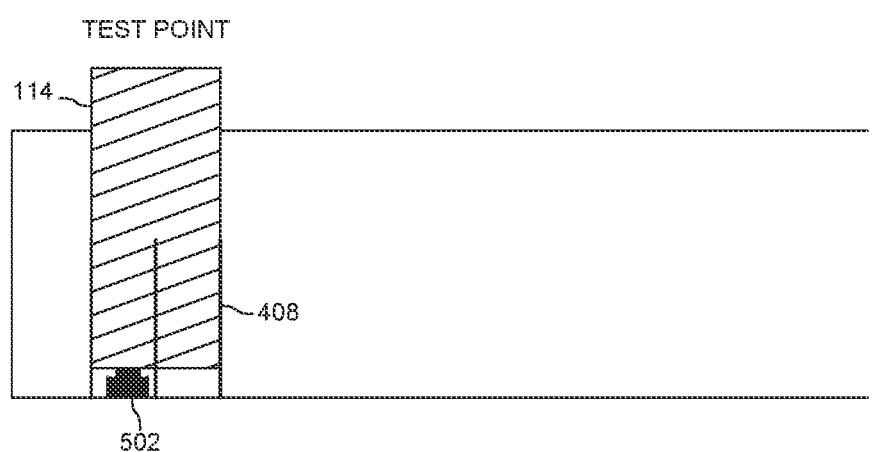

FIGS. 5A and 5B depict an example of a push-button switch according to some embodiments. In FIG. 5A, push-button switch 502 may be a structure that can be actuated by contact. For example, the push-button switch may be pushed in a direction, such as downward or parallel to the insertion direction of test point 114. Push-button switch 502 may be located at the bottom of test point connector 408. However, push-button switch 502 may also be located at other locations, such as the side of test point connector 408. Also, push-button switch 502 may be actuated in any direction, such as parallel to a circuit board or perpendicularly to test point 114.

In FIG. 5B, when test point 114 is inserted into test point connector 408, push-button switch 502 is actuated in a downward direction. When push-button switch 502 is actuated, such as past a threshold, then push-button switch 502 outputs a signal indicating test point 114 has been inserted into test point connector 408. The signal from push-button switch 502 may be used to change switches 112-1 and/or 112-2 to couple test point 114 to upstream test point port 208 and/or downstream test point port 206 as described above.

Figure 6A:
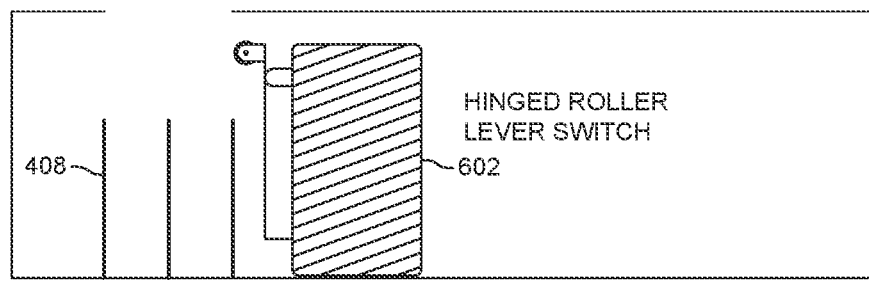
FIGS. 6A and 6B depict an example of a hinge roller lever switch according to some embodiments.
Figure 6B:
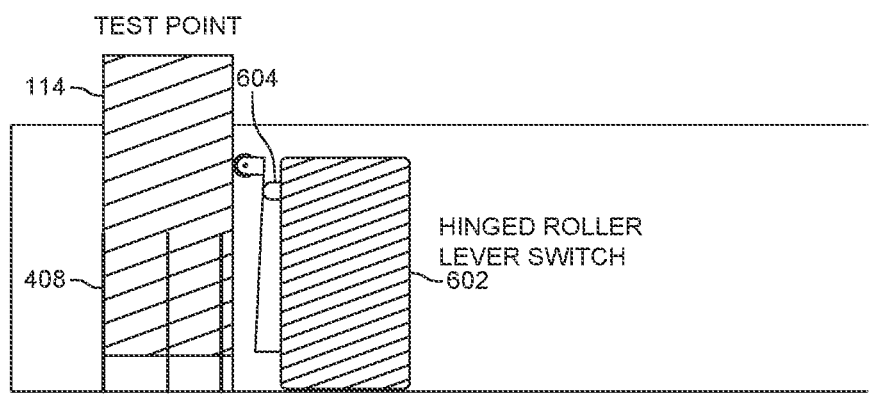

FIGS. 6A and 6B depict an example of a hinge roller lever switch according to some embodiments. In FIG. 6A, hinge folder lever switch 602 may include a lever that can be actuated in a direction. Hinge folder lever switch 602 may be located on a side of test point connector 1208. A lever with a roller is placed proximate to test point connector 1208 such that a test point 114 will contact the roller when inserted in test point connector 1208.

In FIG. 6B, test point 114 has been inserted into test point connector 1208. At 604, the lever of hinge folder lever switch has been moved in a direction that depresses a button. When inserted, test point 114 moves the roller lever in a direction to actuate a button, such as to depress a button on hinge roller lever switch 602. When the button is depressed, hinge roller lever switch 602 outputs a signal indicating test point 114 has been inserted into test point connector 1208. The signal from hinge folder lever switch 602 may be used to change switches 112-1 and/or 112-2 to couple test point 114 to upstream test point port 1008 and/or downstream test point port 1006 as described above.

Switch Control

Figure 7:
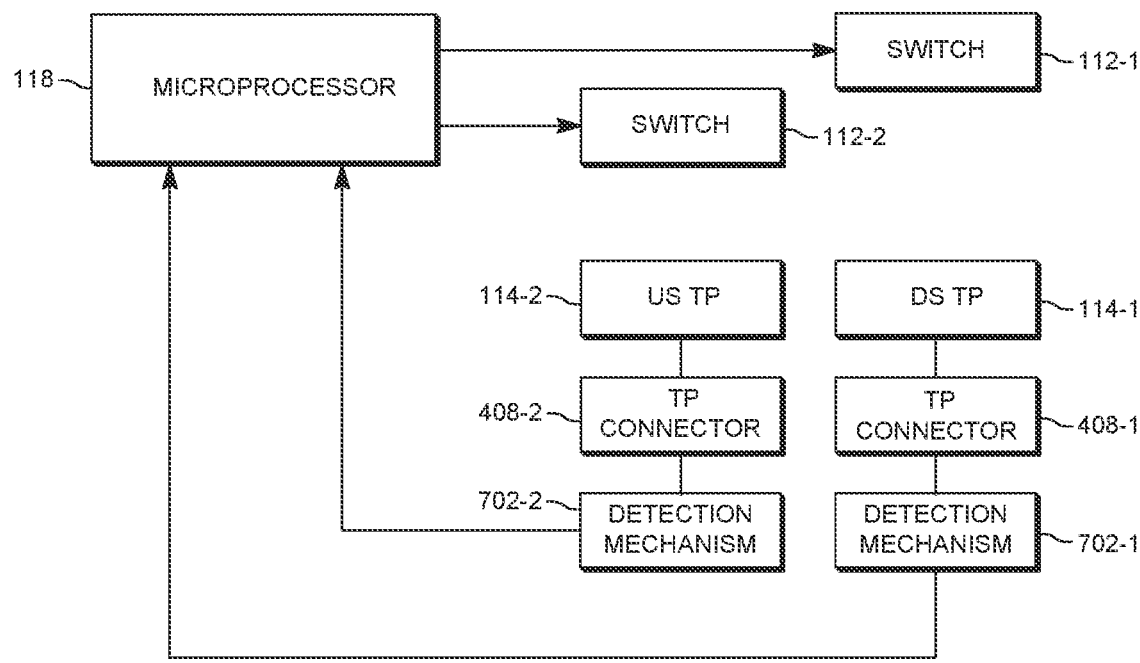
FIG. 7 depicts the signaling to control switches according to some embodiments.

As discussed above, each implementation sent a signal that caused a switch to couple test point 114 to bi-directional coupler 108. FIG. 7 depicts the signaling to control switches 112 according to some embodiments. Node 102 includes a detection mechanism 702-1 that detects whether downstream test point 114-1 is inserted into test point connector 408 and a detection mechanism 702-2 that detects whether upstream test point 114-2 is inserted into test point connector 408. Detection mechanism 702-1 or 702-2 may be one of the detection mechanisms described above or may be a different one. When either detection mechanism 702-1 or 702-2 detects the insertion of a test point 114-1 or 114-2, respectively, detection mechanism 702-1 or 702-2 sends a signal to microprocessor 118.

Microprocessor 118 processes the signal and determines that a test point has been inserted into a respective test point connector 408. Once the test point is inserted into the test point connector 408, microprocessor 118 communicates with switch 112-1 or switch 112-2. For example, when downstream test point 114-1 is inserted into a test point connector 408-1, microprocessor 118 sends a signal to switch 112-1 to couple downstream test point port 206 to downstream test point 114-1. Similarly, when microprocessor 118 detects that test point 114-2 is inserted into a test point connector 408-2, microprocessor 118 sends a signal to switch 112-2 to couple test point connector 114-2 to upstream test point port 208.

Figure 8:
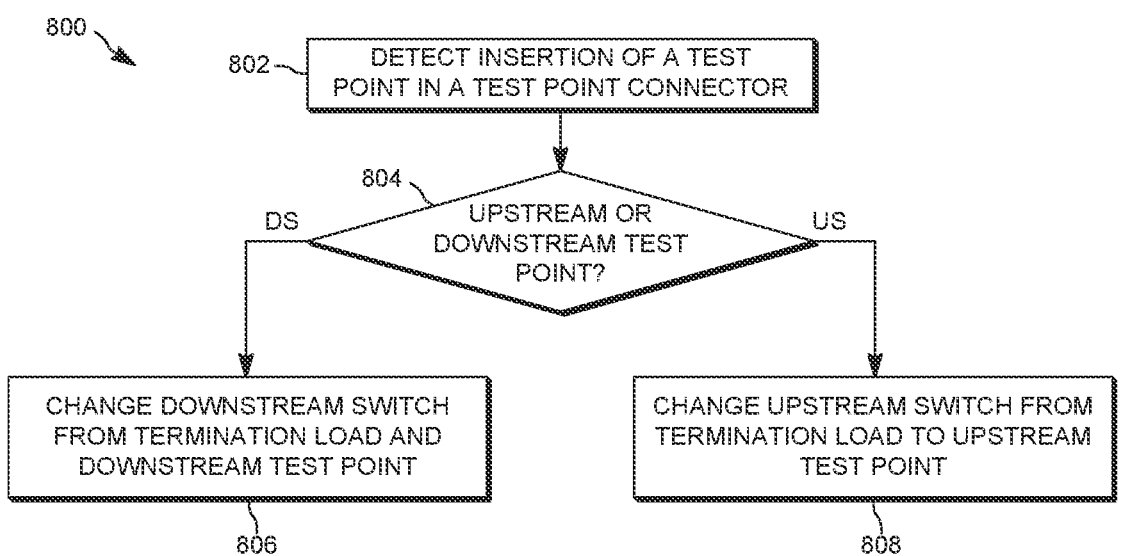
FIG. 8 depicts a simplified flowchart of a method for controlling switches according to some embodiments.

FIG. 8 depicts a simplified flowchart 800 of a method for controlling switches according to some embodiments. At 802, microprocessor 118 detects an insertion of a test point 114 in test point connector 408. At 804, microprocessor 118 determines which test point 114 has been inserted. For example, microprocessor 118 may determine whether an upstream test point 114-2 or a downstream test point 114-1 has been inserted. At 806, when a downstream test point 114-1 has been inserted, microprocessor 118 changes switch 112-1 from termination load 116-1 to downstream test point 114-1.

At 808, when an upstream test point 114-2 has been inserted, microprocessor 118 changes switch 112-2 from termination load 116-2 to upstream test point 114-2. Accordingly, instead of having an open port when a test point is not inserted in a test point connector, some embodiments couple a termination load to provide better isolation for bi-directional coupler 108.

Described herein are techniques for a power supply control system. In the following description, for purposes of explanation, numerous examples and specific details are set forth in order to provide a thorough understanding of some embodiments. Some embodiments as defined by the claims may include some or all of the features in these examples alone or in combination with other features described below, and may further include modifications and equivalents of the features and concepts described herein.

Some embodiments control a power supply voltage being applied to a slot in a node based on the type of module that is inserted into the slot. For example, the slot may be configured to receive a first type of module, such as an analog small-form pluggable (SFP) module. The analog SFP module may be configured to operate with a first power supply voltage, such as a +5V power supply. In some embodiments, a processor for the node may set the default power supply voltage to a second power supply voltage that is different from the first power supply voltage. For example, a lower power supply voltage, such as a +3.3V power supply voltage, may be set as the default power supply voltage to apply to the slot. The +3.3V power supply voltage may be the voltage that a second type of SFP module, such as a digital SFP module, is configured to use or may be a voltage that will not damage the digital SFP module. Thus, if a digital SFP module is accidentally plugged into the slot, the digital SFP module will not be damaged by the power supply voltage of 3.3V. However, if a +5V power supply voltage is being applied to the power supply pin of the digital SFP module, the voltage would damage the digital SFP module because the digital SFP module is not configured to operate with a +5V voltage. The higher voltage could damage some components of the digital SFP module.

To control the power supply voltage, when a module is inserted into a slot of the node, the processor detects the insertion of the module. Then, the processor communicates with the module to determine which type of module has been inserted into the slot. For example, the processor may receive information from the module and use the information to determine whether the module is a digital SFP module or an analog SFP module. Then, the processor may determine the appropriate power supply voltage for the module. For example, the processor can use the +3.3V power supply voltage for a digital SFP module and a +5V power supply voltage for an analog SFP module.

The processor adjusts the power supply voltage being supplied to the power supply pin of the slot to +5V when the analog SFP is detected. However, if the digital SFP module has been inserted into the slot, the processor does not change the power supply voltage.

Figure 9:
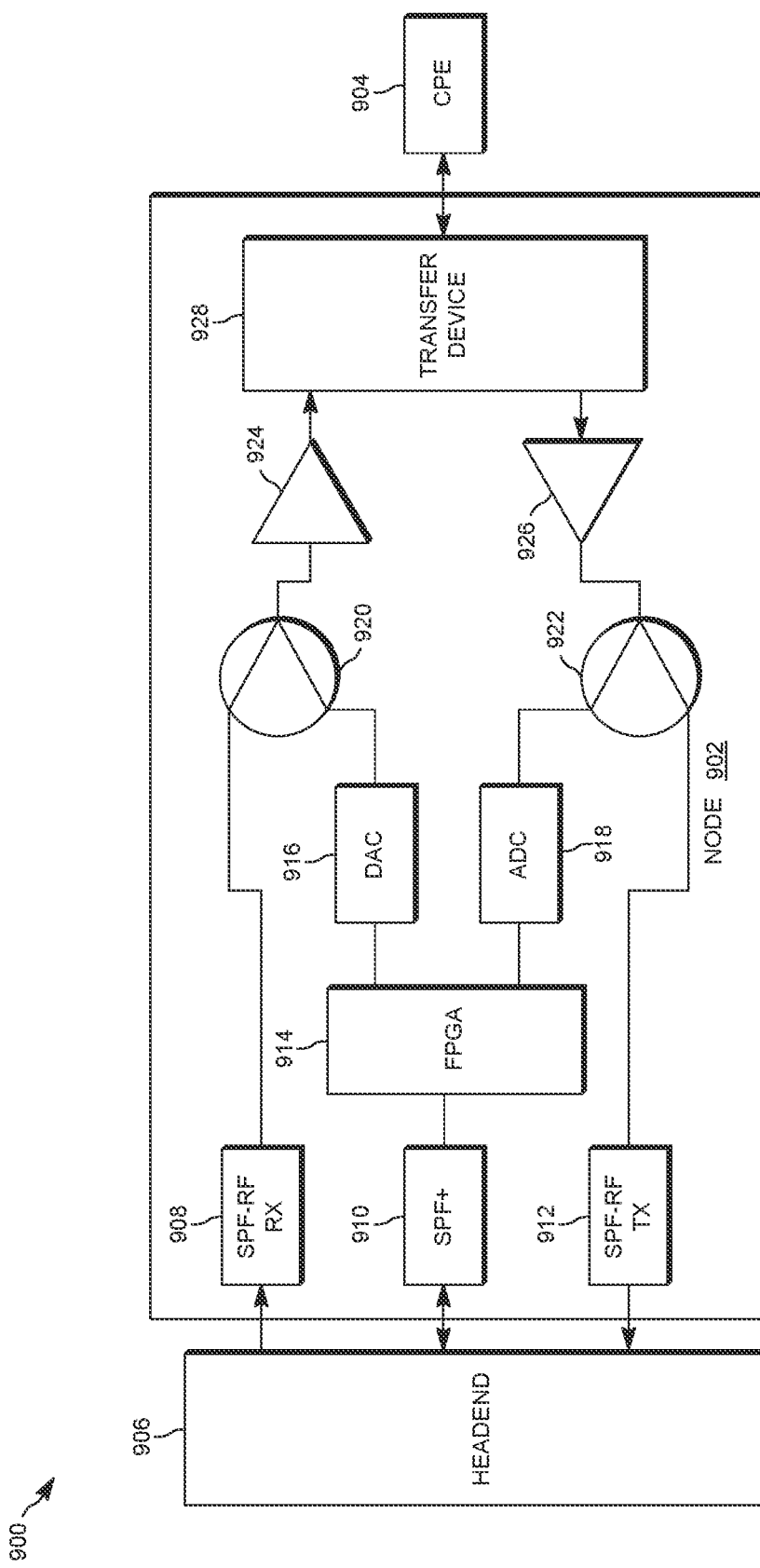
FIG. 9 depicts a simplified system for a network in which a power supply voltage is controlled according to some embodiments.

FIG. 9 depicts a simplified system 100 for a network in which a power supply voltage is controlled according to some embodiments. System 900 includes a headend 906, a node 902, and customer premise equipment (CPE) 904. Headend 906 and node 902 may be separated by a network, such as a digital network, (e.g., an Ethernet or an optical network) and/or analog network (e.g., a radio frequency (RF) network). Node 902 may be located closer to the premises of a subscriber compared to headend 906. The premises of the subscriber includes a network device, such as a CPE 904 (e.g., a cable modem, subscriber device, set-top-box, gateway, etc.). Although this architecture is described, other distributed architectures may be used. Further, the components of node 902 could be located in headend 906.

In a downstream direction, headend 906 sends a digital signal over a digital medium, such as Ethernet or a passive optical network (PON), to node 902. The digital signal is received as electrical signals at a remote physical device in node 902. The remote physical device may be considered the node 902 or be part of node 902 and include the components shown. However, for discussion purposes, the term node 902 will be used. Node 902 converts the digital signal to an analog signal, such as a radio frequency (RF) signal.

Node 902 may also receive an analog signal from headend 106 over an analog medium. Node 902 may then combine the analog signal from the analog medium with the analog signal that was converted from the digital signal from the digital medium. Node 902 sends the combined analog signal (e.g., an RF signal) over an analog medium, such as a coaxial network, to CPE 904.

In an upstream direction, CPE 104 may also transmit an analog signal to node 902 via the analog medium. The analog signal may include portions for transmission through both the digital medium and the analog medium to headend 106. Node 902 then converts at least a portion of the analog signal to a digital signal and sends the digital signal to headend 906 through the digital medium. Additionally, node 902 sends at least a portion of the analog signal to headend 906 through the analog medium.

The processing of the analog signal and digital signal within node 902 will now be discussed in more detail. Different SFP modules may be used to receive and transmit digital and analog signals. An SFP module is a module that can be inserted into a slot in node 902. Although small form pluggable modules are described, other types of modules that can be inserted into areas of node 902 may be used. A first SFP module is configured to receive and send a digital signal and a second SFP module is configured to receive, process, and send an analog signal. In some examples, an analog SFP module cannot receive, process, and send a digital signal, and a digital SFP module cannot receive and send an analog signal.

In the downstream direction, node 902 may receive an analog signal at an analog SFP receiver, such as an SFP-RF receiver (Rx) 908. Node 902 may also receive a digital signal at a digital SFP transceiver, such as an SFP transceiver 110. The digital SFP may be a regular SFP or enhanced SFP+ and may send digital signals both upstream and downstream. A regular digital SFP may support a first amount of gigabits (Gbits) per second of communication. An enhanced SFP (SFP+) may be an enhanced version of the SFP and may support data rates that are higher than the regular SFP, such as 16 Gbit/s. Although the enhanced version will be used for discussion purposes, other SFP types may also be appreciated.

The digital signal is processed by a field programmable gate array (FPGA) 914 that sends the digital signal to a digital to analog converter (DAC) 916 that converts the digital signal to an analog signal. The analog signal from SFP-RF Rx 908 and the digital signal from DAC 916 may be combined in a combiner 920. The analog signal is overlaid with the digital signal in the combined analog signal output by combiner 920. The combined signal may then be amplified by an amplifier 924 and transferred through a device 928 that can then output the analog signal to CPE 904. Transfer device 928 can combine an upstream signal with downstream signal. For example, device 928 may be a diplexer filter that can multiplex signals from two ports to a single port, such as the upstream bandwidth is from 5 to 42 or 85 MHz, and downstream is from 54 or 108 MHz to 0.12 GHz. Also, device 928 may be a coupler that can couple either the upstream signal or the downstream signal in either direction.

In the upstream direction, CPE 904 may transmit an analog signal to node 902. Transfer device 928 sends the analog signal to amplifier 926 for amplification. The analog signal is input into a splitter 922. The analog signal includes a digital portion and an analog portion that may be split at splitter 922. The analog portion is sent to an analog SFP transmitter, such as SFP-RF transmitter (Tx) 912. SFP-RF Tx 912 then sends the analog signal to head end 906.

For the digital portion of the upstream signal, an analog-to-digital converter (ADC) 918 receives the digital portion of the upstream signal and converts the analog signal to digital. FPGA 914 receives the digital signal and provides the digital signal to digital SFP 910. SFP 910 can then send the digital signal to head end 906.

Although the above network configuration is described, it will be understood that other network configurations may be used. Also, other components not shown in node 902 may also be used to process the analog and digital signals.

Figure 10:
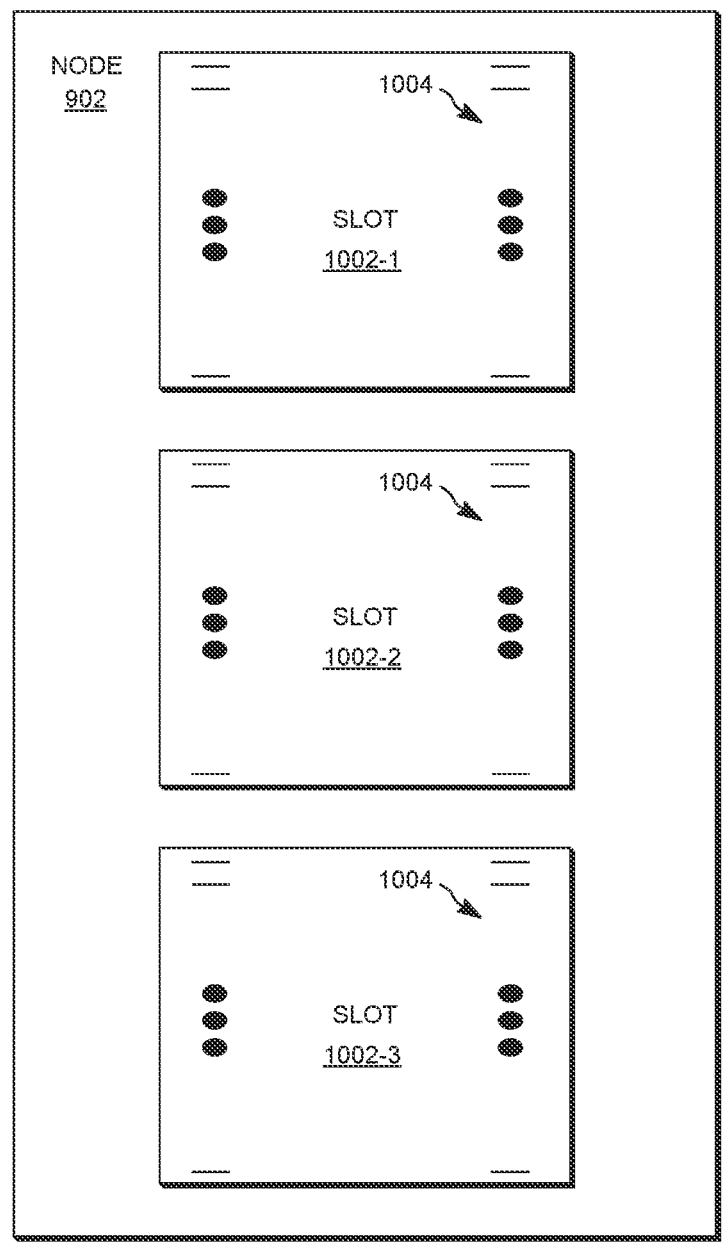
FIG. 10 depicts a more detailed example of a node according to some embodiments.

FIG. 10 depicts a more detailed example of node 902 according to some embodiments. Node 902 includes multiple slots 202-1 to 202-3. Although three slots are shown, node 902 may have a different number of slots, such as 2 slots, 4 slots, 5 slots, etc. Slots 1002-1 to 1002-3 may be specifically configured to operate with a specific type of SFP module. In some examples, slot 1002-1 is configured to operate with SFP-RF Rx 908; slot 1002-2 is configured to operate with digital SFP+910; and slot 1002-3 is configured to operate with SFP-RF Tx 912. By operate, each slot when receiving the correct SFP module, can communicate data appropriately in the upstream and/or downstream directions. When a wrong SFP module is inserted into a slot 1002, that module will not process and transmit signals in node 902 properly. For example, a digital SFP module that is inserted into an analog SFP module slot will not properly process and transmit the analog signal that is received at that slot. Although this configuration is described, other configurations of slots may be appreciated.

Each slot 1002 includes pin connectors 1004 in which pins from an SFP module can be coupled, such as inserted. Pin connectors may be individual connection points that can receive and connect to pins of SFP modules. In some examples, the pin layout dimensions for each slot 1002-1 to 1002-3 is similar or the same. The same may be using identical dimensions when designing the pin layout. The pin layout may be the same dimension-wise, such as the pin connectors are in the same position in the layout, such as in the same spacing arrangement. The connectors are the same in that they can fit both the analog SFP module and the digital SFP module. That is, the number of the pins and layout of the pins and spacing of the pins can receive either the pins of the analog SFP module or the digital SFP module. Further, the connectors may be configured to receive the same type of pins. That is, at least a portion of the pins may be configured to perform similar functions, such as both the analog SFP module and the digital SFP module have a power supply pin in the same position. The packaging of the analog SFP module or the digital SFP module may also look similar. That is, a design of both packages may use similar or the same specifications.

Figure 11:
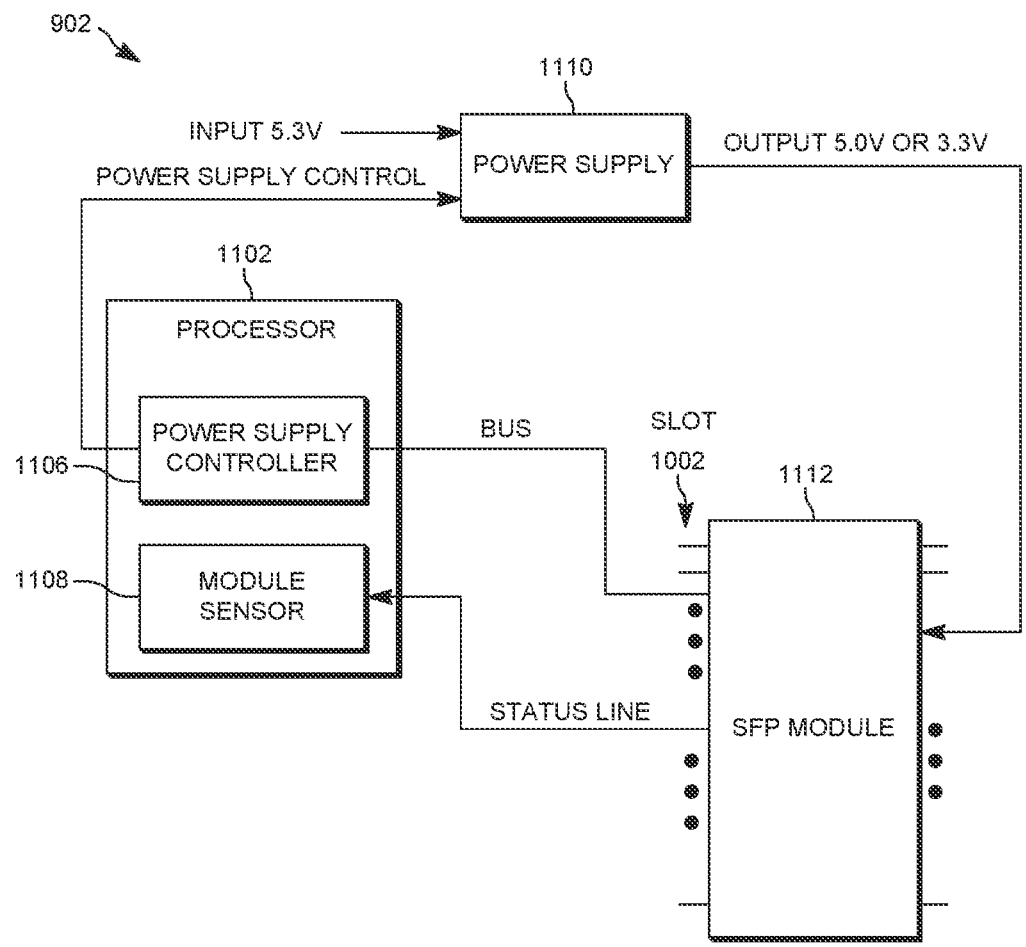
FIG. 11 depicts another more detailed example of the node according to some embodiments.

FIG. 11 depicts a more detailed example of node 102 according to some embodiments. A processor 1102 may configure FPGA 914, DAC 916, ADC 918, transfer device 928, and other components in node 902 based on different requirements. Some embodiments leverage processor 1102 to adjust a power supply voltage based on what type of SFP module is inserted into a slot. For example, processor 1102 is configured to communicate with an SFP module 1112 that has been inserted into a slot 1002. Processor 1102 controls a power supply 310 that can output a first power supply voltage or a second power supply voltage, such as a 5.0V or 3.3V power supply voltage, based on which type of SFP module has been inserted into slot 1002. The described process may be performed for each slot that is configured to receive an analog SFP module.

When SFP module 1112 is inserted into slot 202, processor 1102 senses the insertion via a status line. For example, the status line may be a MOD ABS line that senses when a SFP module 1112 is inserted into a slot 1002. In some examples, the status line is coupled to a pin connector #6, and SFP module 1112 sends a signal through the status line to a module sensor 1108. The signal indicates to module sensor 908 that an SFP module has been inserted into slot 1002.

Module sensor 1108 detects the insertion and causes a power supply controller 1106 to determine which power supply voltage to supply to SFP module 1112. In some examples, power supply controller 1106 communicates through a bus, such as an I2C bus that is connected to a connector of slot 1002 and pin of SFP module 1112. In some examples, the bus is connected to a pin #3 of SFP module 1112. Through the communication, power supply controller 1106 may receive information regarding the type of SFP module 1112 along with other information. For example, SFP module 1112 may send information in an address space of the bus, which may be divided into lower and upper 128 bytes. SFP module 1112 may send the information in one part of the address space, such as the lower 128 bytes of the address space. The information may include the SFP type (e.g., whether the SFP module 312 is a digital SFP/SFP+ module or an analog SFP module). Other information may include the name of the SFP manufacturer and bias voltage, such as whether the SFP module 1112 requires a power supply voltage of 5V or 3.3V.

Figure 12:
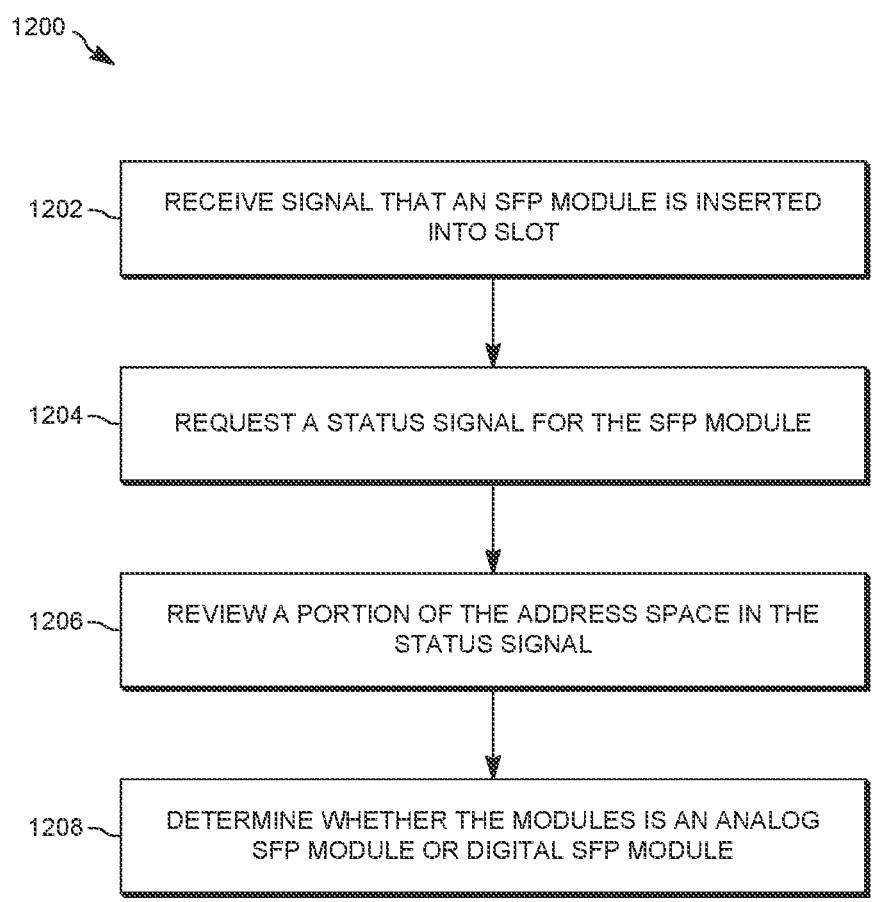
FIG. 12 depicts a simplified flowchart of a method for determining whether a module inserted into a slot is an analog SFP module or a digital SFP module according to some embodiments.

FIG. 12 depicts a simplified flowchart 1200 of a method for determining whether a module inserted into a slot 1002 is an analog SFP module or a digital SFP module according to some embodiments. At 1202, processor 1102 receives a signal that a module is inserted into slot 1002. At 1204, processor 1102 receives a status signal for the SFP module. At 1206, processor 1102 may review a portion of the address space in the status signal. For example, information needed to determine whether the SFP module is an analog SFP module or a digital SFP module may be included in a portion of the 256 bytes of the bus address space. Processor 302 can detect the bytes in a 128 bit address space and determine whether the SFP module is a digital SFP module or an analog SFP module. Also, processor 1102 may determine the bias voltage specified for the SFP module. Determining the bias voltage may allow processor 1102 to use a specified power supply voltage for the SFP module 1112. For example, processor 1102 may dynamically configure the power supply voltage for different SFP modules to multiple values (e.g., more than two values). This may allow more flexibility for configuring the power supply voltage rather than having two power supply voltages for an analog SFP and a digital SFP module.

Referring back to FIG. 11, power supply controller 1106 may send a power supply control message to power supply 1110 when power supply controller 1106 detects that SFP module 1112 is an analog SFP module. This is because by default, power supply 1110 may output a 3.3V power supply voltage (or some other voltage lower than 5V or 3.3V) to SFP module 1112. In some embodiments, the power supply voltage may be output to pin 16 of SFP module 1112, which may be the power supply pin for both the analog SFP module and the digital SFP module. Power supply controller 1106 can send a signal to power supply 1110 to increase the power supply voltage being output from 3.3V to 5.0V. Power supply 1110 can then receive the input 5.3V signal and then output the 5.0V signal instead of the 3.3V signal. Then, the analog SFP module then receives the proper power supply voltage for its specification.

If the SFP module 1112 was a digital SFP module, then power supply controller 1106 may not change the voltage output by power supply 1110. Although 3.3V voltage may be used as the default voltage, power supply 1110 may output other voltages as the default voltage. For example, in other examples, the default voltage may be lower than 3.3V and power supply controller 1106 can increase the voltage to 3.3V upon determining that the digital SFP module has been inserted into slot 1002. In all cases, when an analog SFP module is inserted into slot 1002, power supply controller 1106 can increase the default voltage to 5.0V (or whatever the specified voltage is for the analog SFP module).

Accordingly, when a digital SFP module 1112 is inserted into a slot that is configured for an analog SFP module, the digital SFP module will not be damaged by a power supply voltage that is higher than the digital SFP module is configured to receive. However, when an analog SFP module is correctly inserted into a slot for an analog SFP, processor 1102 can increase the power supply voltage to the configured amount for the analog SFP. Digital SFPs that have the same packaging as analog SFPs, and may be mistakenly inserted into analog SFP slots, are thus not damaged. In some examples, analog SFPs will not be damaged if inserted into a digital SFP slot. Thus, processor 1102 may not have a process to detect and change any power supply voltage for the slots configured to receive digital SFPs.

Figure 13:
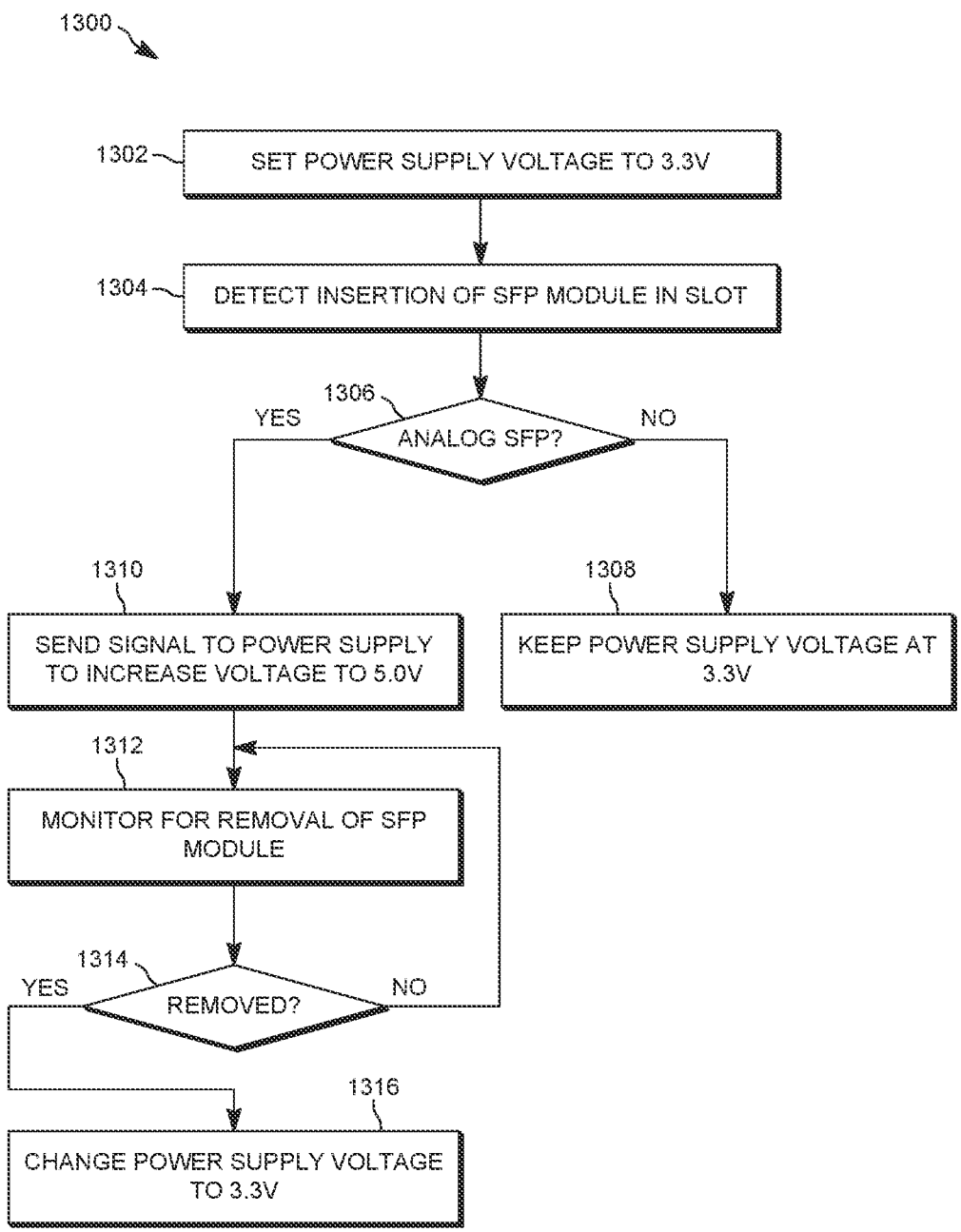
FIG. 13 depicts a simplified flowchart of a method for managing power supply voltages for a slot according to some embodiments.

FIG. 13 depicts a simplified flowchart 1300 of a method for managing power supply voltages for a slot 1002 according to some embodiments. As discussed above, the digital slots may not need to be managed as an analog SFP module that is inserted into a digital slot may not be damaged by the power supply voltage provided to that slot 202. At 1302, processor 1102 sets the power supply voltage output by power supply 1110 to a default voltage, such as 3.3V. Then, at 1304, processor 1102 detects insertion of an SFP module 1112 in slot 1002. The detection may be through a status line that is connected to a pin of SFP module 1112.

At 1306, processor 1102 determines whether or not the SFP module inserted into slot 1002 is an analog SFP. If not, then at 1308, processor 1102 keeps the power supply voltage at 3.3V. For example, processor 1102 may not perform any actions to change the power supply voltage.

If processor 1102 detects that an analog SFP module was inserted into slot 1002, at 1310, processor 1102 sends a signal to power supply 1110 to increase the voltage to 5.0V. Then, power supply 1110 increases the voltage from 3.3 V to 5.0V, which is the configured voltage for an analog SFP module. The analog SFP module may then transmit or receive the analog signal as configured.

At 1312, processor 1102 monitors for removal of the SFP module 1112. At 1314, processor 1102 determines if SFP module 312 was removed. When the SFP module 1112 was removed, at 1316, processor 1102 changes the power supply voltage back to 3.3V. The changing of the power supply voltage back to 3.3V may be immediately performed to ensure that another SFP module 1112 that is inserted into slot 1002 may not be a digital SFP module, which can be damaged by the higher power supply voltage.

Accordingly, some embodiments provide protection for a slot 1002 that may receive SFP modules that may not be configured for the slot. Due to having digital SFP modules and analog SFP modules being manufactured having similar packaging and a similar pin layout, it is possible that a slot 1002 may have an SFP module inserted into it that is not configured to be inserted into that slot. Since the power supply pin for both modules is connected to the same connector, the higher voltage for the analog SFP module may damage the digital SFP module. Not damaging an erroneously inserted digital SFP module will save large replacement costs. Leveraging processor 1102 to control power supply 1110 in node 902 requires minimal cost because processor 1102 is being used to configure other components of node 102, but the control of power supply 1110 saves a large cost when mistakes are made by inserting a wrong SFP module into a slot 1002.

System

Figure 14:
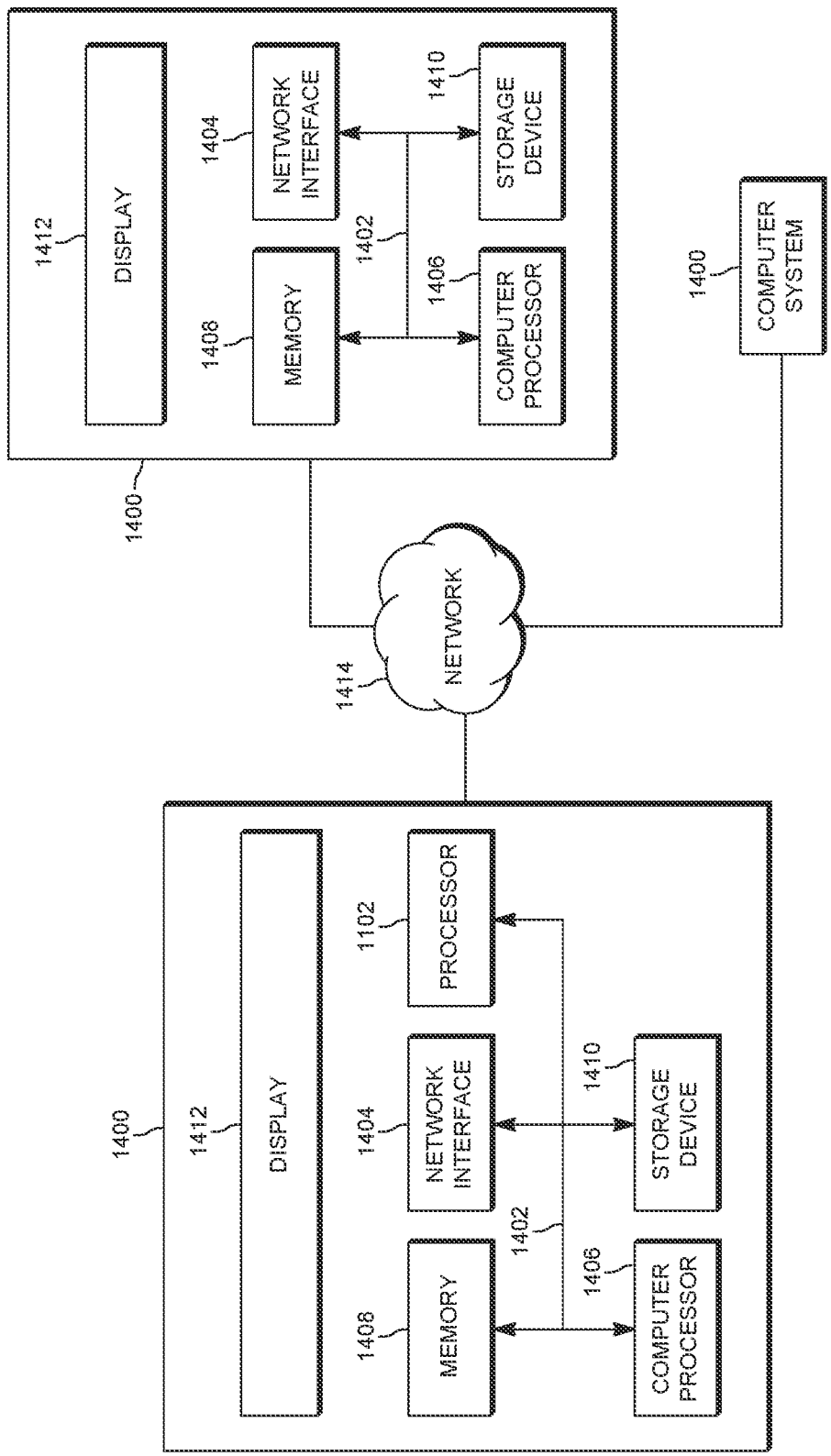
FIG. 14 illustrates an example of special purpose computer systems configured with a processor according to one embodiment.

FIG. 14 illustrates an example of special purpose computer systems 900 configured with node 102 according to one embodiment. Computer system 1400 includes a bus 1402, network interface 1404, a computer processor 1406, a memory 1408, a storage device 1410, and a display 1412.

Bus 1402 may be a communication mechanism for communicating information. Computer processor 906 may execute computer programs stored in memory 1408 or storage device 1408. Any suitable programming language can be used to implement the routines of some embodiments including C, C++, Java, assembly language, etc. Different programming techniques can be employed such as procedural or object oriented. The routines can execute on a single computer system 1400 or multiple computer systems 1400. Further, multiple computer processors 1406 may be used.

Memory 1408 may store instructions, such as source code or binary code, for performing the techniques described above. Memory 1408 may also be used for storing variables or other intermediate information during execution of instructions to be executed by processor 1406. Examples of memory 1408 include random access memory (RAM), read only memory (ROM), or both.

Storage device 1410 may also store instructions, such as source code or binary code, for performing the techniques described above. Storage device 1410 may additionally store data used and manipulated by computer processor 1406. For example, storage device 1410 may be a database that is accessed by computer system 900. Other examples of storage device 1410 include random access memory (RAM), read only memory (ROM), a hard drive, a magnetic disk, an optical disk, a CD-ROM, a DVD, a flash memory, a USB memory card, or any other medium from which a computer can read.

Memory 1408 or storage device 1410 may be an example of a non-transitory computer-readable storage medium for use by or in connection with computer system 1400. The non-transitory computer-readable storage medium contains instructions for controlling a computer system 1400 to be configured to perform functions described by some embodiments. The instructions, when executed by one or more computer processors 1406, may be configured to perform that which is described in some embodiments.

Computer system 1400 includes a display 1412 for displaying information to a computer user. Display 1412 may display a user interface used by a user to interact with computer system 1400.

Computer system 1400 also includes a network interface 1404 to provide data communication connection over a network, such as a local area network (LAN) or wide area network (WAN). Wireless networks may also be used. In any such implementation, network interface 1404 sends and receives electrical, electromagnetic, or optical signals that carry digital data streams representing various types of information.

Computer system 1400 can send and receive information through network interface 1404 across a network 1414, which may be an Intranet or the Internet. Computer system 1400 may interact with other computer systems 1400 through network 1414. In some examples, client-server communications occur through network 1414. Also, implementations of some embodiments may be distributed across computer systems 1400 through network 1414.

Some embodiments may be implemented in a non-transitory computer-readable storage medium for use by or in connection with the instruction execution system, apparatus, system, or machine. The computer-readable storage medium contains instructions for controlling a computer system to perform a method described by some embodiments. The computer system may include one or more computing devices. The instructions, when executed by one or more computer processors, may be configured to perform that which is described in some embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

EMBODIMENTS

Some embodiments may include detecting, by a computing device that includes the first slot and a second slot, a module that is inserted into the first slot of the computing device, wherein the first slot is configured to operate with a first type of module and the second slot is configured to operate with a second type of module, the first slot and the second slot including a same pin position for receiving a power supply pin from the first type of module and the second type of module; communicating, by the computing device, with the module to determine whether the module is the first type of module or the second type of module, the first type of module configured to receive a first type of signal that is combined with a second type of signal from the second type of module at the computing device; and adjusting, by the computing device, a power supply voltage to the power supply pin of the first slot from a first value to a second value when the first type of module is detected.

Some embodiments disclosed herein may also or instead include setting the power supply voltage to the first value before detecting the module being inserted into the first slot. In some embodiments the first value is a default value when no module is inserted into the first slot. Some embodiments may also or instead include detecting when the module is removed from the first slot of the computing device; and changing the power supply voltage from the second value to the first value. In some embodiments the first type of module and the second type of module have a same pin type arrangement. In some embodiments the first type of module and the second type of module have the same pin layout and dimensions. In some embodiments the first slot and the second slot have a same pin type arrangement. In some embodiments the first type of module and the second type of module have a same packaging design.

In some embodiments the first type of module uses a higher power supply voltage than the second type of module. In some embodiments the first type of module uses a 5 volt power supply voltage and the second type of module uses a 3.3 volt power supply voltage. In some embodiments the first type of module is configured to receive an analog signal; and the second type of module is configured to receive a digital signal. Some embodiments may include wherein the computing device overlays the analog signal over an analog signal that is converted from the digital signal, and outputs the combined signal. Some embodiments may include wherein adjusting the power supply voltage comprises: outputting a signal to a power supply to adjust the power supply voltage to the second value.

Some embodiments may include wherein detecting the module is inserted comprises receiving a signal from a pin connected to the module indicating the module is inserted into the first slot. Some embodiments may include wherein communicating with the module comprises: receiving a signal from the module indicating a device type; and analyzing the signal to determine that the device type is the first type of module. Some embodiments may include wherein the first slot is not configured to operate with the second type of module and process the second type of signal.

Some embodiments may include a non-transitory computer-readable storage medium containing instructions that, when executed, control a computer system to be configured for detecting, in the computer system that includes a first slot and a second slot, a module that is inserted into the first slot of the computer system, wherein the first slot is configured to operate with a first type of module and the second slot is configured to operate with a second type of module, the first slot and the second slot including a same pin position for receiving a power supply pin from the first type of module and the second type of module; communicating with the module to determine whether the module is the first type of module or the second type of module, the first type of module configured to receive a first type of signal that is combined with a second type of signal from the second type of module at the computer system; and adjusting a power supply voltage to the power supply pin of the first slot from a first value to a second value when the first type of module is detected. Some embodiments may include the non-transitory computer-readable storage medium configured for setting the power supply voltage to the first value before detecting the module being inserted into the first slot. Some embodiments may include the non-transitory computer-readable storage medium further configured for detecting when the module is removed from the first slot of the computing device; and changing the power supply voltage from the second value to the first value.

Some embodiments may include an apparatus comprising: one or more computer processors; and a non-transitory computer-readable storage medium comprising instructions, that when executed, control the one or more computer processors to be configured for: detecting, in the apparatus that includes a first slot and a second slot, a module that is inserted into the first slot of the apparatus, wherein the first slot is configured to operate with a first type of module and the second slot is configured to operate with a second type of module, the first slot and the second slot including a same pin position for receiving a power supply pin from the first type of module and the second type of module; communicating with the module to determine whether the module is the first type of module or the second type of module, the first type of module configured to receive a first type of signal that is combined with a second type of signal from the second type of module at the apparatus; and adjusting a power supply voltage to the power supply pin of the first slot from a first value to a second value when the first type of module is detected. Some embodiments may include an apparatus capable of performing the method disclosed herein, including the disclosed features alone or in some combination.

What is claimed is:

1. An apparatus comprising:
   a bi-directional coupler for coupling an upstream signal and a downstream signal;
   a termination load;
   the apparatus configured to detect a condition comprising whether a test point device is inserted in a test point connector; and
   a switch configured to switch from being coupled to a first one of the termination load and the test point device to being coupled to the other one of the termination load and the test point device based on detection of the condition.

2. The apparatus of claim 1, wherein the test point device is configured to perform a test of the upstream signal or the downstream signal and comprises a first test point device, the apparatus comprises a first test point detection mechanism, the termination load comprises a first termination load, the test point connector comprises a first test point connector, and the switch comprises a second switch, the apparatus comprising:
   a second termination load;
   a second test point detection mechanism configured to detect when a second test point device is inserted in a second test point connector, wherein the second test point device is configured to perform a second test of the upstream signal or the downstream signal; and
   a second switch configured to switch from being coupled to the second termination load to being coupled to the second test point device when the second test point device is detected as being inserted in the second test point connector, wherein the second switch is configured to switch from being coupled to the second test point device to being coupled to the second termination load when the second test point device is detected as being removed from being inserted in the second test point connector.

3. The apparatus of claim 2, wherein the bi-directional coupler comprises:
   a first port configured to receive the upstream signal or the downstream signal;
   a second port configured to send the upstream signal or the downstream signal to a network device;
   a third port coupled to the first switch and the first port; and
   a fourth port coupled to the second switch and the second port.

4. The apparatus of claim 1, comprising a push button configured to detect the insertion of the test point device in the test point connector using actuation of the push button.

5. The apparatus of claim 4, wherein the push button detects the insertion of the test point device in the test point connector when the test point device actuates the push button in a first direction.

6. The apparatus of claim 5, wherein the push button detects a removal of the test point device from the test point connector when the push button is actuated in a second direction.

7. The apparatus of claim 1, comprising a light sensor configured to detect the insertion of the test point device in the test point connector using a light.

8. The apparatus of claim 7, wherein the light sensor detects a change in the light being sensed to detect the insertion of the test point device.

9. The apparatus of claim 8, wherein the insertion of the test point device in the test point connector blocks the light from being sensed by the light sensor.

10. The apparatus of claim 7, wherein the light sensor detects a removal of the test point device from the test point connector when the light is detected from a state of not being detected.

11. The apparatus of claim 7, further comprising an emitter configured to generate the light detected by the light sensor.

12. The apparatus of claim 1, comprising a lever device configured to detect the insertion of the test point device in the test point connector using an actuation of a lever.

13. The apparatus of claim 12, wherein the lever device detects the insertion of the test point device in the test point connector when the lever is actuated in a first direction.

14. The apparatus of claim 13, wherein the lever device detects a removal of the test point device from the test point connector when the lever is actuated in a second direction.

15. A method comprising:
    configuring a switch to couple a termination load to a bi-directional coupler, the bi-directional coupler configured to couple an upstream signal and a downstream signal;
    detecting a condition comprising a test point device being inserted in a test point connector; and
    configuring the switch to switch from being coupled to a first one of the termination load and the test point device to being coupled to the other one of the termination load and the test point device based on detection of the condition.

16. The method of claim 15, wherein the test point device is configured to perform a test of the upstream signal or the downstream signal and comprises a first test point device, the apparatus comprises test point detection mechanism comprises a first test point detection mechanism, the termination load comprises a first termination load, the test point connector comprises a first test point connector, and the switch comprises a second switch, the method further comprising:
    configuring a second switch to couple a second termination load to the bi-directional coupler;
    detecting a second test point device being inserted in a second test point connector; and
    configuring the second switch to switch from being coupled to the second termination load to being coupled to the second test point device when the second test point device is detected as being inserted in the second test point connector, wherein the second switch is configured to switch from being coupled to the second test point device to being coupled to the second termination load when the second test point device is detected as being removed from being inserted in the second test point connector.

17. The method of claim 16, comprising detecting the insertion of the test point device in the test point connector using actuation of a push button in a first direction.

18. The method of claim 15, comprising detecting the insertion of the test point device in the test point connector using a light sensor that sensing a light not being detected.

19. The method of claim 15, comprising detecting the insertion of the test point device in the test point connector using an actuation of a lever.

* * * * *